United States Patent
Kishida et al.

(10) Patent No.: US 11,777,456 B2
(45) Date of Patent: Oct. 3, 2023

(54) AMPLIFYING APPARATUS, RADAR DEVICE AND AMPLIFYING METHOD

(71) Applicant: Furuno Electric Co., Ltd., Nishinomiya (JP)

(72) Inventors: Takehiro Kishida, Nishinomiya (JP); Keisuke Tanaka, Nishinomiya (JP); Daisuke Fujioka, Nishinomiya (JP); Masayuki Shiromoto, Nishinomiya (JP)

(73) Assignee: FURUNO ELECTRIC CO., LTD., Nishinomiya (JP)

( * ) Notice: Subject to any disclaimer, the term of this patent is extended or adjusted under 35 U.S.C. 154(b) by 473 days.

(21) Appl. No.: 17/136,023

(22) Filed: Dec. 29, 2020

(65) Prior Publication Data

US 2021/0211101 A1    Jul. 8, 2021

(30) Foreign Application Priority Data

Jan. 8, 2020    (JP) .................................. 2020-001134

(51) Int. Cl.
  *H03F 1/52*    (2006.01)
  *H02H 3/20*    (2006.01)
  (Continued)

(52) U.S. Cl.
  CPC .............. *H03F 1/523* (2013.01); *H02H 3/20* (2013.01); *H03F 3/193* (2013.01); *H03F 3/211* (2013.01);
  (Continued)

(58) Field of Classification Search
  CPC .......... H03F 1/523; H03F 3/193; H03F 3/211; H03F 2203/21106; H02H 3/20; H03K 17/0822; H04B 1/0466; H04B 2001/049
  (Continued)

(56) References Cited

U.S. PATENT DOCUMENTS 6,043,712 A * 3/2000 Leizerovich .......... H03F 1/0261
                                                    330/297
2010/0331057 A1* 12/2010 Tanaka .............. H04W 52/0264
                                                    455/574

(Continued)

FOREIGN PATENT DOCUMENTS

JP    S44-15246 Y1    7/1969
JP    H02-52512 A     2/1990
(Continued)

OTHER PUBLICATIONS

European Office Action dated Jan. 26, 2023 in corresponding European Patent Application No. 20 215 997.6, 6 pages.

(Continued)

*Primary Examiner* — Hafizur Rahman
(74) *Attorney, Agent, or Firm* — XSENSUS LLP

(57) ABSTRACT

An amplifying apparatus is provided, which includes a power-source main line, a plurality of amplifying control devices which include an amplifier, a power-source branch line, an over current protector. The amplifier amplifies a high-frequency signal. The power-source branch line is branched from the power-source main line. The over current protector disposed for the power-source branch line is connected to the amplifier and configured to disconnect the power-source branch line based on drive current flowing through the amplifier from the power-source branch line. The power-source main line is common to the plurality of amplifying control devices.

18 Claims, 11 Drawing Sheets

(51) Int. Cl.
  *H03F 3/193* (2006.01)
  *H03F 3/21* (2006.01)
  *H03K 17/082* (2006.01)
  *H04B 1/04* (2006.01)

(52) U.S. Cl.
  CPC ....... *H03K 17/0822* (2013.01); *H04B 1/0466* (2013.01); *H03F 2203/21106* (2013.01); *H04B 2001/0491* (2013.01)

(58) Field of Classification Search
  USPC .......................................................... 330/298
  See application file for complete search history.

(56) References Cited

U.S. PATENT DOCUMENTS

| | | | |
|---|---|---|---|
| 2011/0292554 A1* | 12/2011 | Yao | H03F 3/72 361/56 |
| 2013/0051416 A1 | 2/2013 | Schmelzer et al. | |
| 2015/0270806 A1* | 9/2015 | Wagh | H03F 3/45188 330/296 |
| 2015/0326191 A1 | 11/2015 | Funahashi et al. | |
| 2017/0359033 A1 | 12/2017 | Bazzani et al. | |

FOREIGN PATENT DOCUMENTS

| | | |
|---|---|---|
| JP | H05-145357 A | 6/1993 |
| JP | 5508729 B2 | 6/2014 |
| JP | 2019-180044 A | 10/2019 |

OTHER PUBLICATIONS

Extended European search report dated May 14, 2021, in corresponding European patent Application No. 20215997.6, 8 pages.
Office Action dated Jul. 25, 2023 in Japanese Patent Application No. 2020-001134 and computer-generated English translation thereof, 6 pages.

\* cited by examiner

| NUMBER OF FAILURES | TRANSMISSION | APC TARGET VALUE | ATTENUATION |
|---|---|---|---|
| 0 | TRANSMIT | Pn0 | ATT0 (BASED ON Pn0) |
| 1 | TRANSMIT | Pn1 | ATT1 (BASED ON Pn1) |
| 2 | TRANSMIT | SUSPEND APC | ATTc (FIXED VALUE) |
| 3 | TRANSMIT | SUSPEND APC | ATTc (FIXED VALUE) |
| 4 | SUSPEND TRANSMISSION | — | — |

FIG. 10

AMPLIFYING APPARATUS, RADAR DEVICE AND AMPLIFYING METHOD

CROSS-REFERENCE TO RELATED APPLICATION

The application claims priority under 35 U.S.C. § 119 to Japanese Patent Application No. 2020-001134, which was filed on Jan. 8, 2019, the entire disclosure of which is hereby incorporated by reference.

TECHNICAL FIELD

The present disclosure relates to a technology for amplifying a high-frequency signal.

BACKGROUND

JP2010-175333A discloses a power amplifier which amplifies the high-frequency signal.

Although the number of final-stage amplifiers is one in JP2010-175333A, a plurality of final-stage amplifiers may be provided. When supplying power to the plurality of amplifiers through a common supply line, broken amplifier may give an adverse effect to other circuit elements which constitute an amplifying apparatus, such as other amplifying circuits (which is also referred to as amplifying control device) which are not failed.

SUMMARY

Therefore, one purpose of the present disclosure is to provide an amplifying apparatus and an amplifying method, which suppress an adverse effect by a broken amplifier among a plurality of amplifiers to other circuit elements.

According to one aspect of the present disclosure, an amplifying apparatus is provided, which includes a power-source main line, a plurality of amplifying control devices which include an amplifier, a power-source branch line, an over current protector. The amplifier amplifies a high-frequency signal. The power-source branch line is branched from the power-source main line. The over current protector disposed for the power-source branch line is connected to the amplifier and configured to disconnect the power-source branch line based on drive current flowing through the amplifier from the power-source branch line. The power-source main line is common to the plurality of amplifying control devices.

According to this configuration, the amplifier of which the drive current changed due to its failure, is disconnected from the common power-source main line.

According to the present disclosure, an adverse effect by a broken amplifier to other circuit elements can be suppressed.

The monitoring circuitry 351 may be further configured to generate a monitoring signal based on a change in the drive current or a change in a drive voltage corresponding to the drive current.

A failure count detector 60 may be configured to output a failure count detection signal indicative of a number of failures that is a number of power-source branch lines 92 disconnected by the over current protector 32, based on a signal intensity of the monitoring signal.

The adjusting circuitry preferably may be further configured to adjust an input intensity of the high-frequency signal into the amplifiers based on the number of failures.

A parameter controller 40 may be further configured to set a parameter of the adjusting circuitry 42 based on the number of failures.

The adjusting circuitry 42 may be further configured to set the parameter to a fixed value when the number of failures is over a threshold.

The parameter controller 40 may be further configured to set the parameter based on signal intensities of the high-frequency signals outputted from the amplifiers 31.

The parameter controller 40 preferably may be further configured to set the parameter based on a target value of the signal intensity according to the number of failures.

The adjusting circuitry 42 may be further configured to be comprising a variable attenuator connected to input of the amplifier 31.

A switch 34 may be configured to switch on/off a power supply of the amplifier 31 based on the monitoring signal.

A synthesizer 204-206 may be configured to synthesize the high-frequency signals outputted from the amplifiers 31.

BRIEF DESCRIPTION OF DRAWINGS

The present disclosure is illustrated by way of example and not by way of limitation in the figures of the accompanying drawings, in which like reference numerals indicate like elements and in which:

FIG. 10 is view illustrating one example of a control table for the second transmission control of the present disclosure.

DETAILED DESCRIPTION

Figure 1:
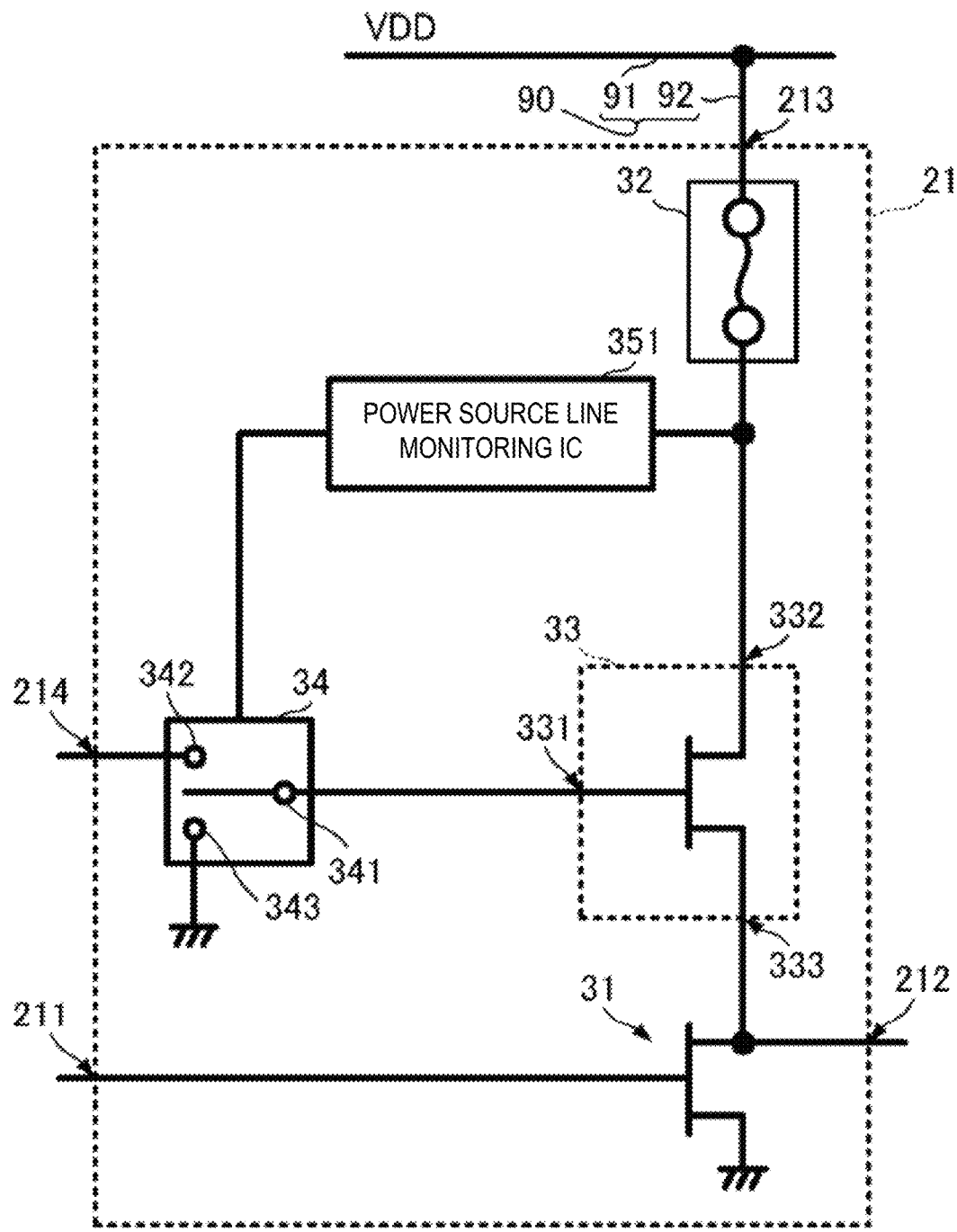
FIG. 1 is a circuit diagram illustrating a configuration of a sole amplifying circuit which constitutes a final-stage amplifying part (which is also referred to as an amplifier) according to one embodiment of the present disclosure.
Figure 2:
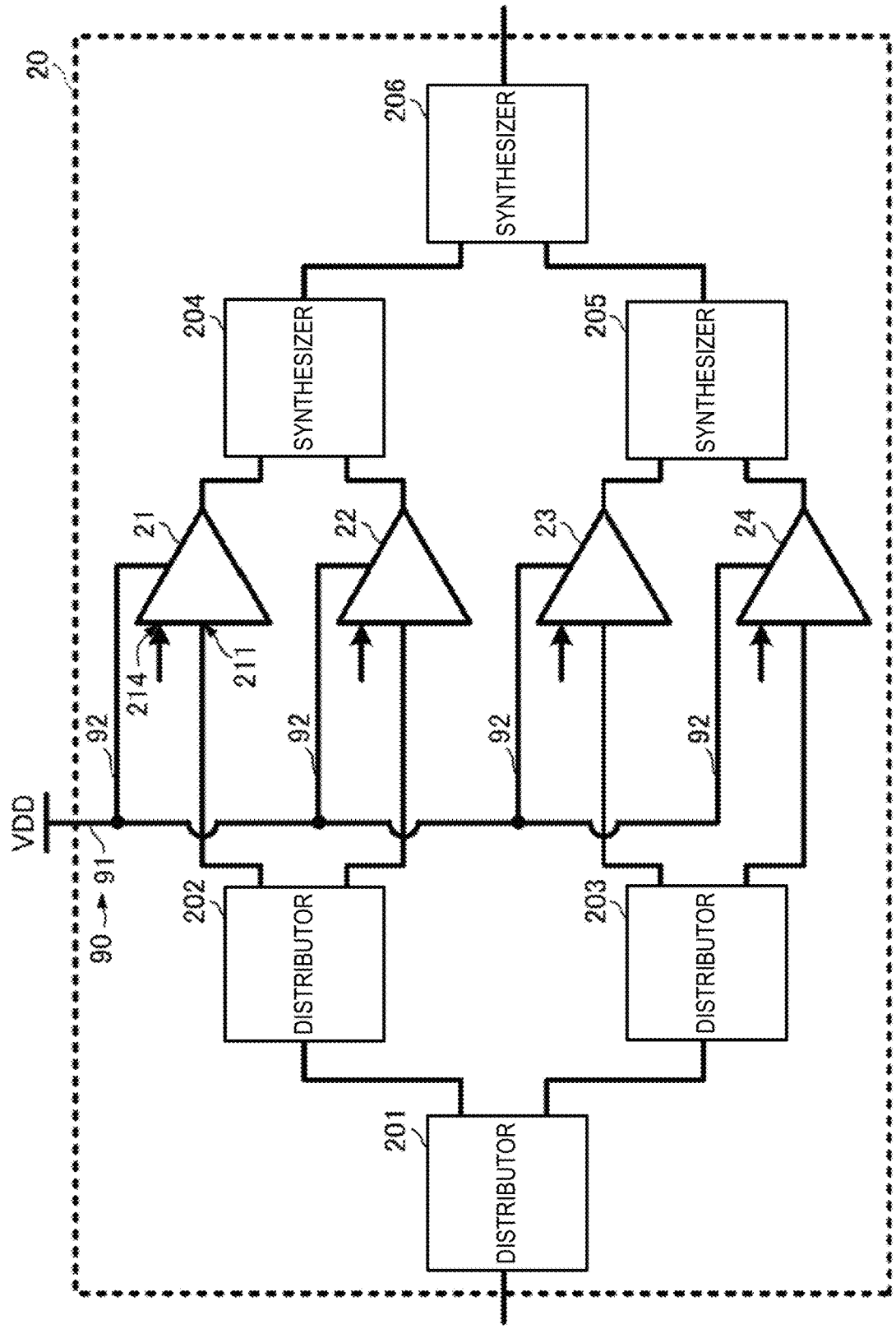
FIG. 2 is a circuit diagram illustrating a configuration of the final-stage amplifying part according to this embodiment of the present disclosure.
Figure 3B:
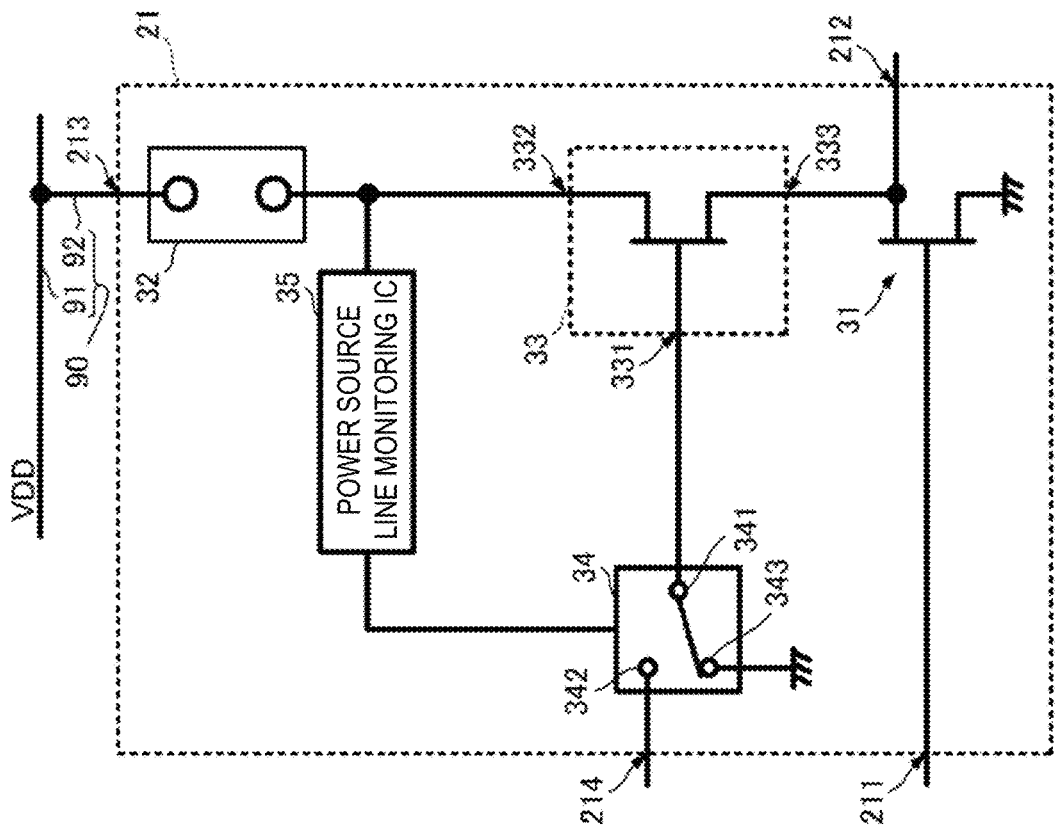
FIG. 3B is a circuit diagram illustrating an abnormal operating state of the amplifying circuit.
Figure 3A:
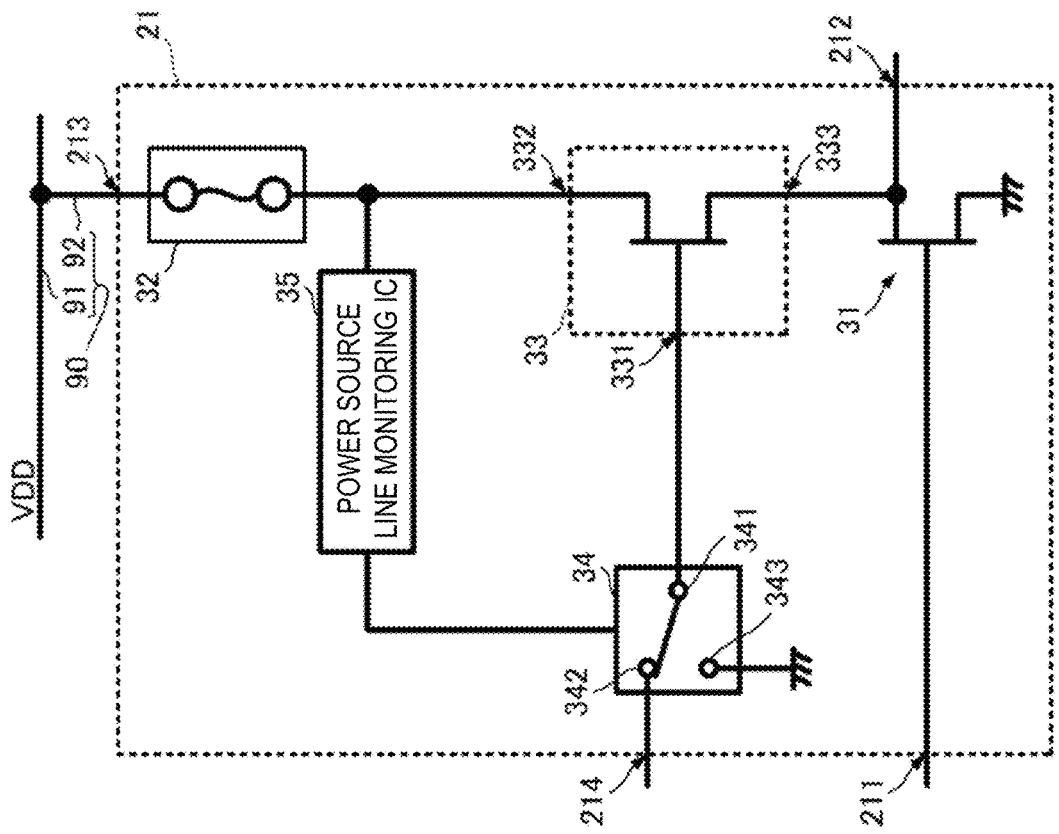
FIG. 3A is a circuit diagram illustrating a normal operating state of the amplifying circuit.

An amplifying apparatus, a transmission device, and an amplifying method according to one embodiment of the present disclosure will be described with reference to the accompanying drawings. FIG. 1 is a circuit diagram illustrating a configuration of a sole amplifying circuit which constitutes a final-stage amplifying part according to this embodiment of the present disclosure. FIG. 2 is a circuit diagram illustrating a configuration of the final-stage amplifying part according to this embodiment of the present disclosure. FIG. 3A is a circuit diagram illustrating a normal operating state of the amplifying circuit, and FIG. 3B is a circuit diagram illustrating an abnormal operating state of the amplifying circuit.

(Configuration of Final-Stage Amplifying Part)

First, a configuration of the final-stage amplifying part is described with reference to FIG. 2. As illustrated in FIG. 2, a final-stage amplifying part 20 may include four amplifying circuits 21-24, three distributors 201-203, three synthesizers 204-206, and a power source line 90. In detail, the amplifying circuits 21-24 may be amplifying circuits using a semiconductor. In detail, the distributors 201-203 are comprised of a microstrip line, for example. In detail, the synthesizers 204-206 are comprised of a microstrip line, for example.

The distributor 201 may be connected to the distributor 202 and the distributor 203. The distributor 202 may be connected to the amplifying circuit 21 and the amplifying circuit 22. The distributor 203 may be connected to the amplifying circuit 23 and the amplifying circuit 24.

The synthesizer 204 may be connected to the amplifying circuit 21 and the amplifying circuit 22. The synthesizer 205 may be connected to the amplifying circuit 23 and the amplifying circuit 24. The synthesizer 206 may be connected to the synthesizer 204 and the synthesizer 205.

The distributor 201 may distribute an inputted high-frequency signal and output them to the distributor 202 and the distributor 203. The distributor 202 may distribute the high-frequency signal inputted from the distributor 201 and output them to the amplifying circuit 21 and the amplifying circuit 22. The distributor 203 may distribute the high-frequency signal inputted from the distributor 201 and output them to the amplifying circuit 23 and the amplifying circuit 24.

The synthesizer 204 may synthesize the high-frequency signal amplified by the amplifying circuit 21 and the high-frequency signal amplified by the amplifying circuit 22, and output it to the synthesizer 206. The synthesizer 205 may synthesize the high-frequency signal amplified by the amplifying circuit 23 with the high-frequency signal amplified by the amplifying circuit 24, and output it to the synthesizer 206. The synthesizer 206 may synthesize the high-frequency signal outputted from the synthesizer 204 with the high-frequency signal outputted from the synthesizer 205, and output it.

By such a configuration, the final-stage amplifying part 20 may amplify the high-frequency signals with a substantially high gain.

The power source line 90 may be connected to the amplifying circuit 21, the amplifying circuit 22, the amplifying circuit 23, and the amplifying circuit 24. The power source line 90 may be a power source line common to the amplifying circuit 21, the amplifying circuit 22, the amplifying circuit 23, and the amplifying circuit 24. The power source line 90 is provided with a power-source main line 91 and a plurality of power-source branch lines 92, for example. The plurality of power-source branch lines 92 may branch from the power-source main line 91, and may be connected to the amplifying circuit 21, the amplifying circuit 22, the amplifying circuit 23, and the amplifying circuit 24, respectively. By this configuration, the power source line 90 may supply drive voltage VDD to the amplifying circuit 21, the amplifying circuit 22, the amplifying circuit 23, and the amplifying circuit 24.

The amplifying circuit 21, the amplifying circuit 22, the amplifying circuit 23, and the amplifying circuit 24 may have a similar configuration. A supply control signal may be inputted into the amplifying circuit 21, the amplifying circuit 22, the amplifying circuit 23, and the amplifying circuit 24. The amplifying circuit 21, the amplifying circuit 22, the amplifying circuit 23, and the amplifying circuit 24 may control the drive voltage VDD applied to each amplifying element according to the supply control signal.

By this configuration, the drive voltage VDD may be applied to the amplifying circuit 21, the amplifying circuit 22, the amplifying circuit 23, and the amplifying circuit 24 during an output period of the high-frequency signal, and the drive voltage VDD may be not applied during other periods. As described above, the final-stage amplifying part 20 may output a pulse-shaped high-frequency signal with a high output intensity by synthesizing the output signal of the amplifying circuit 21, the output signal of the amplifying circuit 22, the output signal of the amplifying circuit 23, and the output signal of the amplifying circuit 24.

(Configuration of Amplifying Circuit 21)

The amplifying circuit 21, the amplifying circuit 22, the amplifying circuit 23, and the amplifying circuit 24 may have a similar configuration as described above. Therefore, below, the amplifying circuit 21 may be described representing the circuits.

As illustrated in FIG. 1, the amplifying circuit 21 may include a final-stage amplifier 31, a fuse 32, a drain voltage control circuit 33, a switch 34, and a power source line monitoring IC 351 (which is also referred to as monitoring circuitry). The final-stage amplifier 31 may correspond to an "amplifying part" of the present disclosure, and the fuse 32 may correspond to a "over current protector" of the present disclosure.

The final-stage amplifier 31 is comprised of an FET, for example. The gate of the FET may be connected to an input part 211 of the amplifying circuit 21 for the high-frequency signal. The source of the FET may be grounded. The drain of the FET may be connected to an output part 212 of the amplifying circuit 21 for the high-frequency signal. Moreover, the drain of the FET may be connected to the drain voltage control circuit 33.

The drain voltage control circuit 33 is, for example, comprised of an FET, and may include a first connecting part 331, a second connecting part 332, and a third connecting part 333. The gate of the FET may be connected to the first connecting part 331, the drain of the FET may be connected to the second connecting part 332, and the source of the FET may be connected to the third connecting part 333. The second connecting part 332 may be connected to the fuse 32, and the third connecting part 333 may be connected to the drain of the FET which constitutes the final-stage amplifier 31. Note that the FET stage which constitutes the drain voltage control circuit 33 is not limited to a single stage, but may be multiple stages.

The fuse 32 may be connected between the second connecting part 332 of the drain voltage control circuit 33 and the common power source line 90. In other words, one of terminals of the fuse 32 may be connected to the second connecting part 332 of the drain voltage control circuit 33, and the other terminal of the fuse 32 may be connected to the power-source branch line 92. In other words, the fuse 32 may be inserted in an intermediate part of the power-source branch line 92.

The switch 34 may include a terminal 341, a terminal 342, and a terminal 343. The terminal 341 may be selectively connected to the terminal 342 and the terminal 343. The terminal 341 may be connected to the first connecting part 331 of the drain voltage control circuit 33. The terminal 342 may be connected to an input part 214 of the final-stage amplifying part 20 for the supply control signal. The terminal 343 may be grounded.

The power source line monitoring IC 351 (which is also referred to as monitoring circuitry) may be connected to one end of the fuse 32, and the second connecting part 332 of the drain voltage control circuit 33. Moreover, the power source line monitoring IC 351 may be connected to the switch 34. The power source line monitoring IC 351 may generate a monitoring signal corresponding to the voltage at one end of the fuse 32, and output it to the switch 34. For example, the monitoring signal may have a signal intensity proportional to the voltage value at one end of the fuse 32.

The high-frequency signal may be inputted into the final-stage amplifier 31 through the input part 211. The drive voltage VDD may be applied to the final-stage amplifier 31 through the fuse 32 and the drain voltage control circuit 33.

In more detail, in a state where the terminal 341 and the terminal 342 are connected in the switch 34, if the supply control signal inputted from the input part 214 is in a HIGH state (ON state), the drain and the source of the FET in the drain voltage control circuit 33 may be conductive therebetween. Therefore, the drive voltage VDD may be applied to the final-stage amplifier 31 through the fuse 32 and the drain voltage control circuit 33. On the other hand, in a state where the terminal 341 and the terminal 342 are connected in the switch 34, if the supply control signal inputted from the input part 214 is in a LOW state (OFF state), the drain and the source of the FET in the drain voltage control circuit 33 may be opened therebetween. Therefore, the drive voltage VDD may not be applied to the final-stage amplifier 31.

By switching the supply control signal between the ON state and the OFF state, a period during which the final-stage amplifier 31 operates to amplify and output the high-frequency signal, and a period during which the final-stage amplifier 31 does not operate and not output the high-frequency signal may occur. Therefore, the amplifying circuit 21 may output the pulse-shaped high-frequency signal of which the signal intensity is amplified.

(Failsafe Operation by Configuration of Amplifying Circuits 21-24)

In such a configuration, the amplifying circuit 21 may operate as follows, for example, when the final-stage amplifier 31 is broken or failed and short-circuits.

When the final-stage amplifier 31 is failed and a short-circuit occurs between the drain and the source, large drive current of the final-stage amplifier 31 may flow from the power-source main line 91 through the power-source branch line 92, the fuse 32, and the drain voltage control circuit 33. This current may cut the fuse 32. Therefore, the power-source branch line 92 may be disconnected. That is, the connection between the drain voltage control circuit 33 and the final-stage amplifier 31, and the power-source main line 91 may be disconnected.

Thus, a voltage drop of the power-source main line 91 can be suppressed, and drops of the drive voltages of other amplifying circuits 22, 23, and 24 which are connected to other power-source branch lines 92 branched from the power-source main line 91 can be suppressed. Therefore, the operating states of the amplifying circuit 22, the amplifying circuit 23, and the amplifying circuit 24 may be maintained. When any of the amplifying circuit 22, the amplifying circuit 23, and the amplifying circuit 24 is failed, the operating states of other amplifying circuits may be maintained similarly.

Thus, by configuring the amplifying circuits 21-24 as described above, an adverse effect to other amplifying circuits due to the failure of the final-stage amplifying part can be suppressed.

Moreover, the power source line monitoring IC 351 may detect a voltage of the fuse 32 at the drain voltage control circuit 33 side (the drive voltage to the final-stage amplifier 31), and generate the monitoring signal having a signal intensity according to this voltage. The power source line monitoring IC 351 may output the monitoring signal to the switch 34.

As illustrated in FIG. 3A, the switch 34 may connect the terminal 341 and the terminal 342 in a normal state and a state where the final-stage amplifier 31 operates in response to the supply control signal. The normal state may be a state where the final-stage amplifier 31 is not failed, the fuse 32 is not cut, and the drive voltage VDD is supplied to the drain voltage control circuit 33 and the final-stage amplifier 31 from the power source line 90. At this time, the terminal 341 and the terminal 343 may be disconnected.

When the voltage of the fuse 32 at the drain voltage control circuit 33 side falls by the disconnection of the fuse 32, the signal intensity of the monitoring signal may also change (fall). Therefore, the signal intensity of the monitoring signal applied to the switch 34 may change (fall).

As illustrated in FIG. 3B, by this change (fall), the switch 34 may disconnect the terminal 341 and the terminal 342 and switch the connection so that the terminal 341 and the terminal 343 are connected. Thus, the gate of the FET in the drain voltage control circuit 33 may be grounded, and the controlling part 40 (see FIG. 5 described later) which is an output source of the supply control signal and the drain voltage control circuit 33 may be disconnected. Therefore, poor operations, such as the voltage drop of the supplied power to the controlling part 40 and a malfunction can be suppressed.

Thus, by configuring the amplifying circuits 21-24 as described above, the adverse effect to other circuits (other circuits connected to the amplifying circuits) due to the failure of the final-stage amplifier can be suppressed.

(Failsafe Processing Method)

Figure 4:
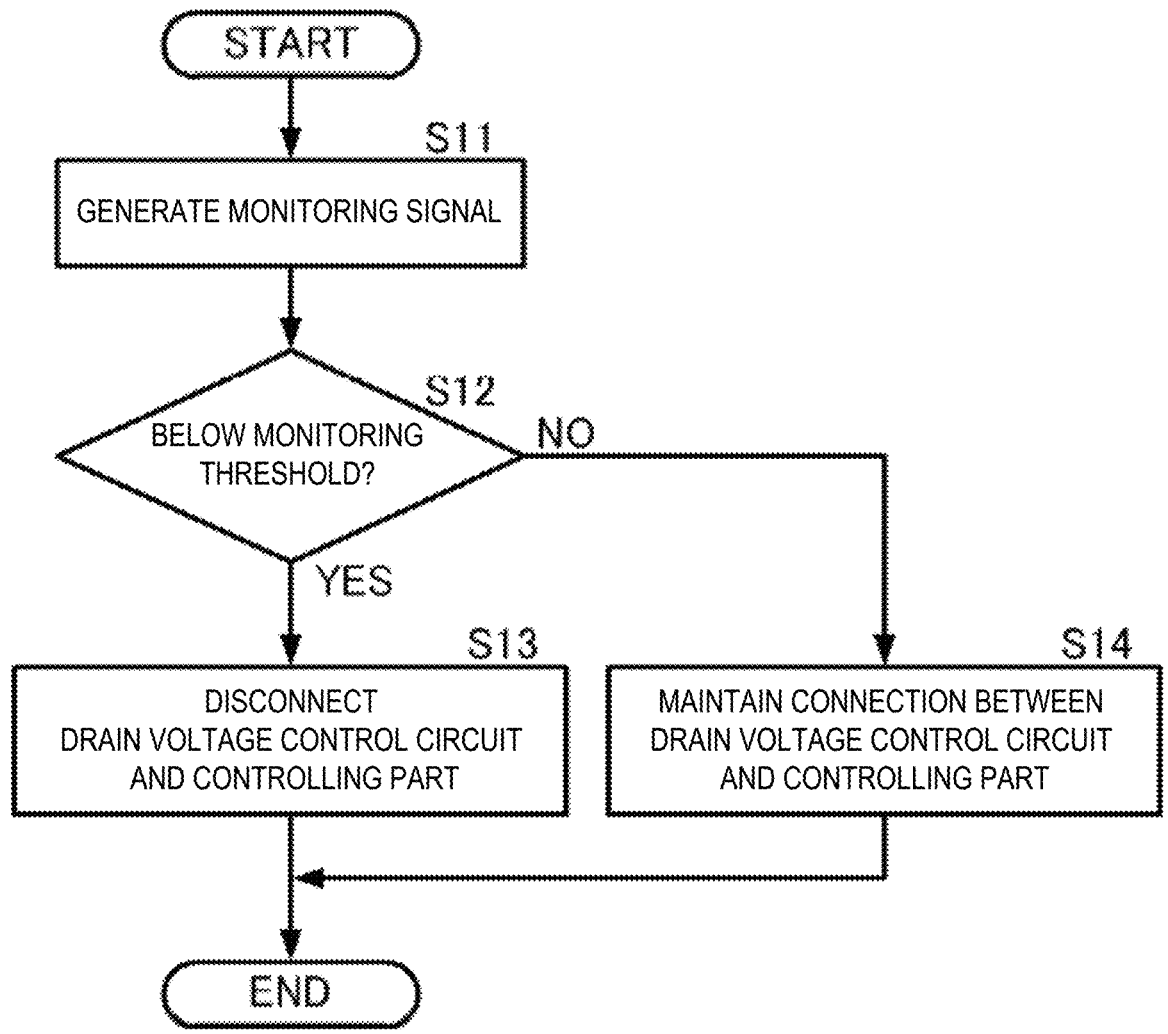
FIG. 4 is a flowchart illustrating a failsafe processing according to this embodiment of the present disclosure.

Each of the amplifying circuits 21-24 may perform a processing as the failsafe processing, for example, in accordance with a flow illustrated in FIG. 4. FIG. 4 is a flowchart illustrating the failsafe processing according to this embodiment of the present disclosure.

As illustrated in FIG. 4, the power source line monitoring IC 351 may detect the voltage of the fuse 32 at the drain voltage control circuit 33 side, and generate the monitoring signal (S11).

If the signal intensity of the monitoring signal becomes below a monitoring threshold (S12: YES), the switch 34 may disconnect the drain voltage control circuit 33 and the controlling part 40 (S13). That is, if the final-stage amplifier 31 is failed and short-circuits, the fuse 32 is cut, and the voltage of the fuse 32 at the drain voltage control circuit 33 side falls, the signal intensity of the monitoring signal may fall accordingly. In addition, if the signal intensity of the monitoring signal becomes below the monitoring threshold, the drain voltage control circuit 33 and the controlling part 40 may be disconnected.

If the signal intensity of the monitoring signal is not below the monitoring threshold (S12: NO), the switch 34 may maintain the connection between the drain voltage control circuit 33 and the controlling part 40 (S14). That is, if the final-stage amplifier 31 is not failed, the fuse 32 will not be cut. Therefore, the voltage of the fuse 32 at the drain voltage control circuit 33 side may be maintained at the drive voltage VDD, and the signal intensity of the monitoring signal may also be maintained in the high state. In this case, the connection between the drain voltage control circuit 33 and the controlling part 40 may be maintained.

By performing such a failsafe processing, the adverse effect to other amplifying circuits and other circuits can be suppressed when the final-stage amplifier 31 is failed.

(Configuration of Transmission Device)

Figure 5:
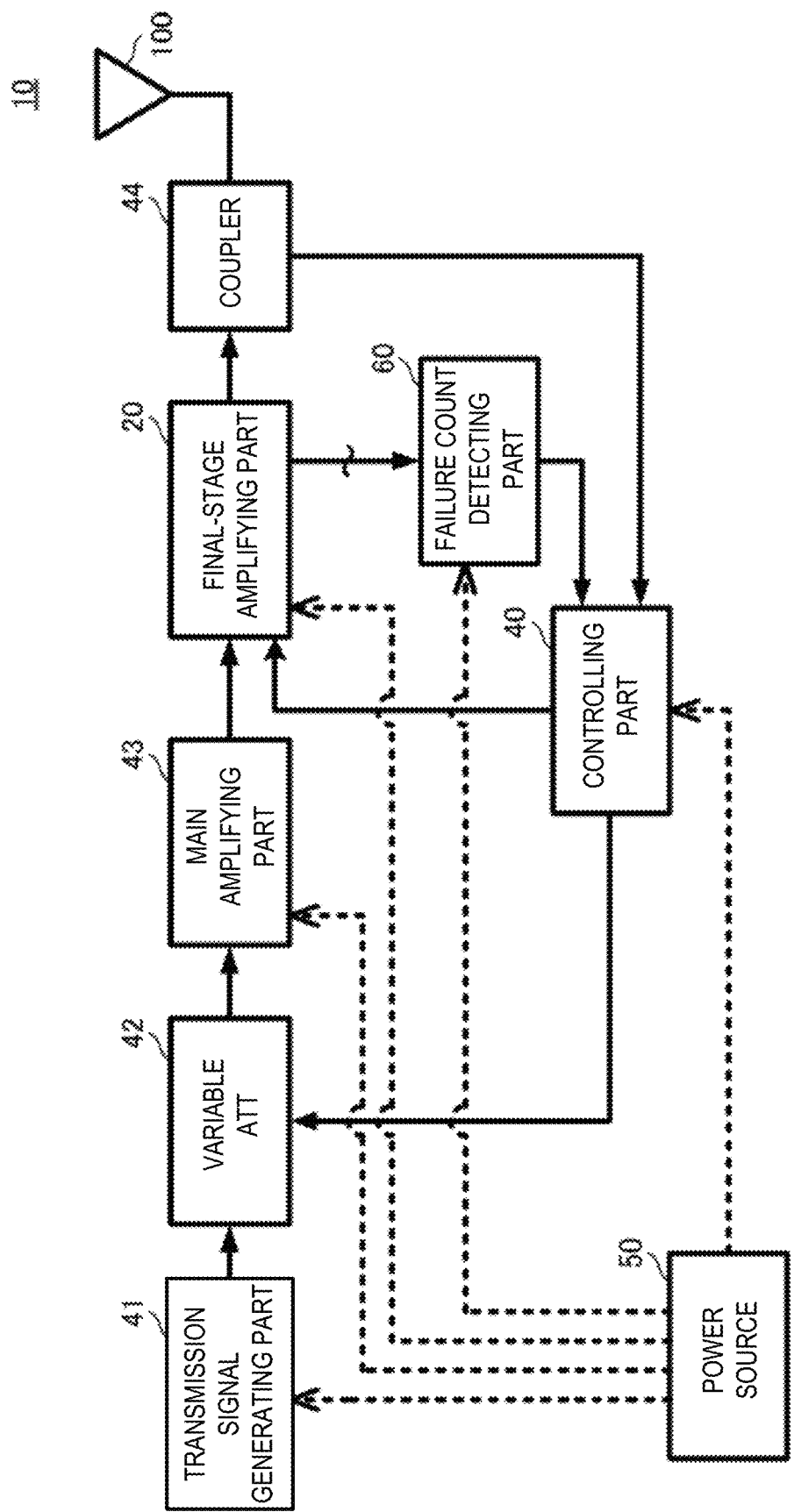
FIG. 5 is a functional block diagram illustrating a configuration of a transmission device according to this embodiment of the present disclosure.

The final-stage amplifying part 20 may be used for the transmission device as illustrated in FIG. 5, for example. FIG. 5 is a functional block diagram illustrating a configuration of the transmission device according to this embodiment of the present disclosure.

As illustrated in FIG. 5, a transmission device 10 may include the final-stage amplifying part 20, a transmission signal generating part 41, a variable ATT (attenuator) 42, a main amplifying part 43, a coupler 44, the controlling part 40, a power source 50, a failure count detecting part 60, and an antenna 100.

The power source 50 may supply power to parts of the transmission device 10 which need the supply of power. As one example, the power source 50 may supply the power to the final-stage amplifying part 20, and the drive voltage VDD may be supplied by this power.

The transmission signal generating part 41 may generate the high-frequency signal at a given frequency, and output it to the variable ATT 42. One example of the concrete configuration of the transmission signal generating part 41 is known, and therefore, description thereof is omitted.

The variable ATT 42 may be comprised of a variable resistor, for example. The variable ATT 42 may be set so that an attenuation given from the controlling part 40 is obtained. The variable ATT 42 may attenuate the inputted high-frequency signal by the set attenuation, and output it to the main amplifying part 43.

The main amplifying part 43 may be comprised of, for example, semiconductor amplifying circuits connected in a plurality of stages, and filters connected between these amplifying circuits. The main amplifying part 43 may amplify the high-frequency signal from the variable ATT 42, and output it to the final-stage amplifying part 20. The amplification factor of the main amplifying part 43 may be set, for example, so that a waveform of the high-frequency signal is not distorted by the amplification, and so that a given signal intensity is obtained.

The final-stage amplifying part 20 may be provided with the configuration described above, and amplify the high-frequency signal from the main amplifying part 43 so that it becomes a target intensity during the transmission. Moreover, the final-stage amplifying part 20 may receive the supply control signal from the controlling part 40, and perform an amplifying processing according to the supply control signal. Therefore, the pulse-shaped high-frequency signal can be generated as described above. The final-stage amplifying part 20 may output the high-frequency signal (transmission signal) which amplified and waveform-controlled, to the antenna 100 through the coupler 44.

The antenna 100 may transmit the inputted transmission signal. The coupler 44 may distribute a part of the transmission signal as a reference signal, and output it to the controlling part 40.

The controlling part 40 may set an APC target value. The APC target value may be a target signal intensity by amplifying the transmission signal inputted into the antenna 100. The controlling part 40 may set the attenuation of the variable ATT 42 so that the signal intensity of the transmission signal becomes the APC target value, while monitoring the signal intensity of the reference signal. As described above, the attenuation setting may be given to the variable ATT 42, and the variable ATT 42 may set a resistance value for achieving this attenuation.

By such a configuration, the transmission device 10 may control the transmission signal so that it becomes the target signal intensity, and transmit the transmission signal of which the signal intensity is controlled, to external devices from the antenna 100. Therefore, the transmission device 10 can transmit the transmission signal at the substantially stable signal intensity.

Moreover, by the final-stage amplifying part 20 having the configuration described above being provided, the transmission device 10 can perform the failsafe when the final-stage amplifier 31 of the final-stage amplifying part 20 is failed, and the adverse effect to other circuits of the transmission device 10 due to this failure can be suppressed.

(Control of Transmission Power)

Figure 6:
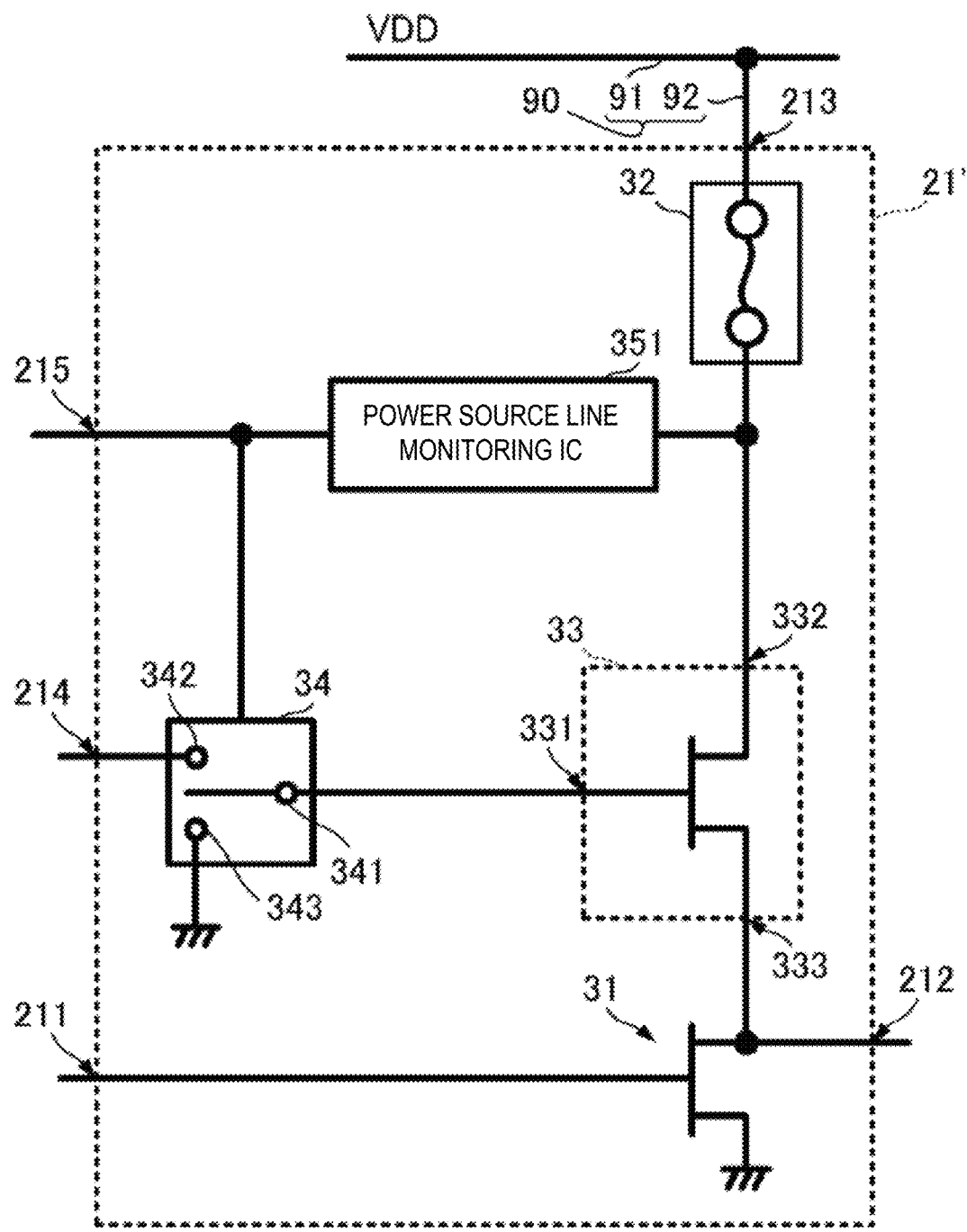
FIG. 6 is a circuit diagram illustrating another example of the amplifying circuit according to this embodiment of the present disclosure.
Figure 7:
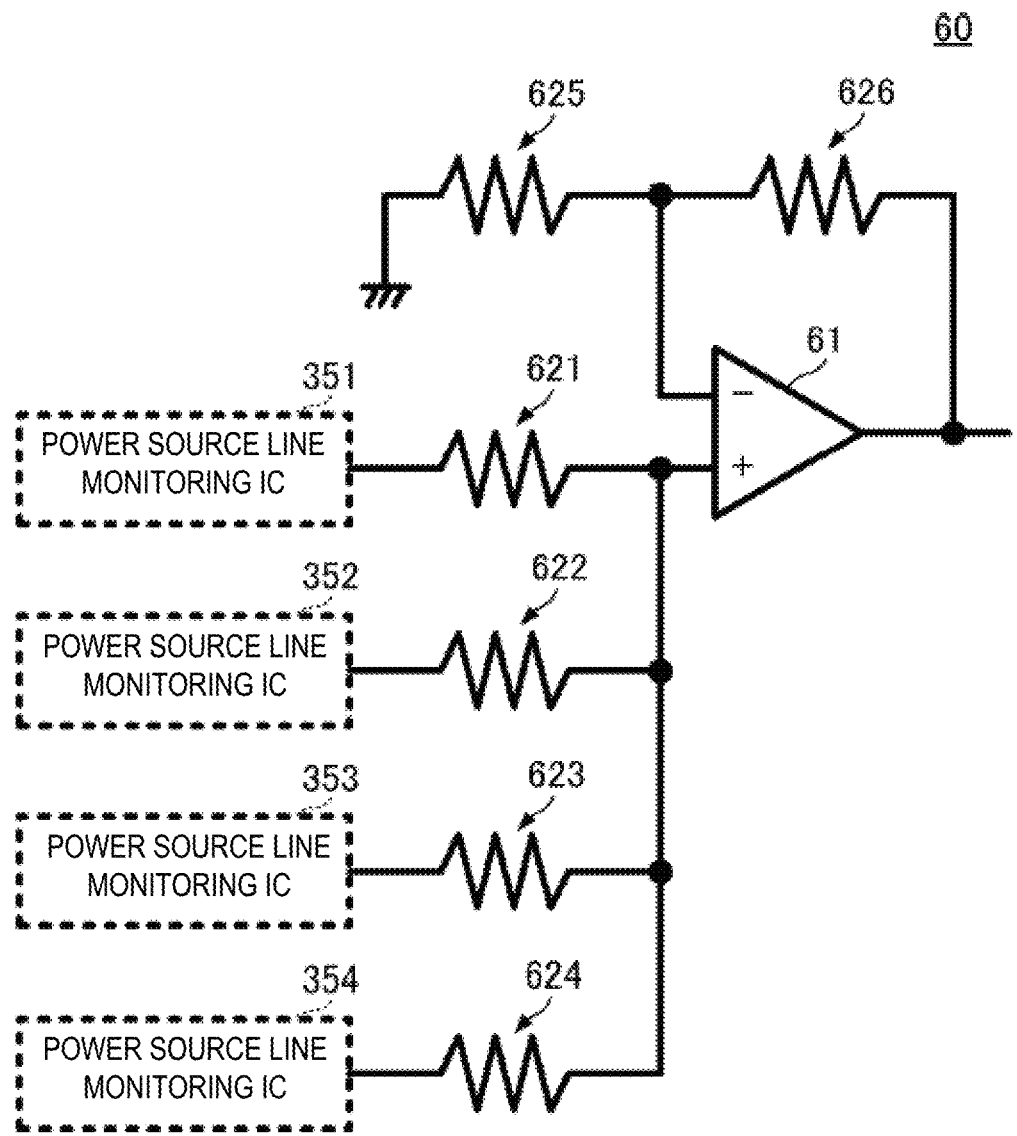
FIG. 7 is a circuit diagram illustrating a configuration of a failure count detecting part (which is also referred to as failure count detector)

The transmission device 10 can perform a further effective transmission control by further having the following configuration. FIG. 6 is a circuit diagram illustrating another example of one amplifying circuit according to this embodiment of the present disclosure. FIG. 7 is a circuit diagram illustrating a configuration of the failure count detecting part.

An amplifying circuit 21' illustrated in FIG. 6 differs from the amplifying circuit 21 illustrated in FIG. 1 in that it is further provided with an output part of the monitoring signal. Other configurations of the amplifying circuit 21' illustrated in FIG. 6 are similar to those of the amplifying circuit 21 illustrated in FIG. 1, and therefore, description of the similar parts is omitted.

The amplifying circuit 21' may be provided with an output part 215 for the monitoring signal. The output part 215 for the monitoring signal may be connected to the power source line monitoring IC 351. The power source line monitoring IC 351 may output the monitoring signal to the switch 34 and output the same signal to the output part 215 for the monitoring signal. Note that other amplifying circuits which constitute the final-stage amplifying part 20 each may be similarly provided with an output terminal for the monitoring signal. The monitoring signal outputted from each amplifying circuit may be inputted into the failure count detecting part 60.

The failure count detecting part 60, roughly, may add up a signal intensity of the monitoring signal of the power source line monitoring IC 351 of the amplifying circuit 21', a signal intensity of the monitoring signal of a power source line monitoring IC 352 of an amplifying circuit 22' (not illustrated), a signal intensity of the monitoring signal of a power source line monitoring IC 353 of an amplifying circuit 23' (not illustrated), and a signal intensity of the monitoring signal of a power source line monitoring IC 354 of an amplifying circuit 24' (not illustrated), and output it as a failure count detection signal.

In detail, for example, as illustrated in FIG. 7, the failure count detecting part 60 may include an operational amplifier 61 and resistors 621-626. The resistor 621 may be connected to the power source line monitoring IC 351 through the output part 215. The resistor 622 may be connected to the power source line monitoring IC 352 through an output part 225 (not illustrated). The resistor 623 may be connected to the power source line monitoring IC 353 through an output part 235 (not illustrated). The resistor 624 may be connected to the power source line monitoring IC 354 through an output part 245 (not illustrated). The resistor 621, the resistor 622, the resistor 623, and the resistor 624 may be connected to a non-inverted input terminal of the operational amplifier 61. The output terminal of the operational amplifier 61 may be connected to an inverted input terminal of the operational amplifier 61 through the resistor 626. A connecting part of the inverted input terminal and the resistor 626 may be grounded through the resistor 625.

By such a configuration, the signal intensity of the failure count detection signal may depend on the number of failures (failure count). For example, here, the (abnormal) signal intensity of the monitoring signal during a detection of an abnormality (failure) may be a LOW level, and the normal signal intensity of the monitoring signal may be HIGH level. Therefore, the signal intensity of the failure count detection signal may become lower as the number of failures increases. That is, the signal intensity of the failure count detection signal may become lower when one amplifying circuit is failed and three amplifying circuits are normal than when the four amplifying circuits are normal. The signal intensity of the failure count detection signal may become lower when two amplifying circuits are failed and two amplifying circuits are normal than when one amplifying circuit is failed and three amplifying circuits are normal. The signal intensity of the failure count detection signal may become lower when three amplifying circuits are failed and one amplifying circuit is normal than when two amplifying circuits are failed and two amplifying circuits are normal. The signal intensity of the failure count detection signal may become lower when three amplifying circuits are failed and one amplifying circuit is normal (total failure) than when three amplifying circuits are failed and one amplifying circuit is normal.

The failure count detection signal having such a signal intensity may be inputted into the controlling part 40. The controlling part 40 may calculate the number of failures based on the failure count detection signal.

The controlling part 40 may change the APC target value according to the number of failures. In more detail, it may set the APC target value lower as the number of failures increases. Then, the controlling part 40 may set the attenuation (corresponding to a "parameter related to the adjustment" of the present disclosure) according to the APC target value setting, and give it to the variable ATT 42. The variable ATT 42 may correspond to an "adjusting circuitry" of the present disclosure, and the controlling part 40 may correspond to a "parameter controller" of the present disclosure.

By such a configuration, the transmission device 10 can suppress that the signal intensity of the high-frequency signal inputted into the unfailed amplifying circuit becomes higher, and, for example, the final-stage amplifier 31 is saturated.

In more detail, the signal intensity of the transmission signal may fall when the number of operable amplifying circuits decreases due to the failure. In this case, if the configuration of the present disclosure is not provided, the attenuation of the variable ATT 42 will be set so that it becomes smaller to achieve the APC target value. Thus, the signal intensity of the high-frequency signal inputted into the amplifying circuit may become higher, and the final-stage amplifier 31 of the amplifying circuit will be saturated.

However, by reducing the APC target value according to the number of failures, it is not necessary to largely change the attenuation of the variable ATT 42. Thus, a degree of the signal intensity of the high-frequency signal inputted into the amplifying circuit becoming higher can be suppressed, and the final-stage amplifier 31 of the amplifying circuit being saturated can be suppressed.

Therefore, the transmission device 10 can suppress the occurrence of side lobes of the transmission signal. That is, the transmission device 10 can transmit the transmission signal while suppressing the occurrence of the side lobes, if all of the final-stage amplifiers of the final-stage amplifying part 20 are not failed.

(Transmission Control Method #1)

Figure 8:
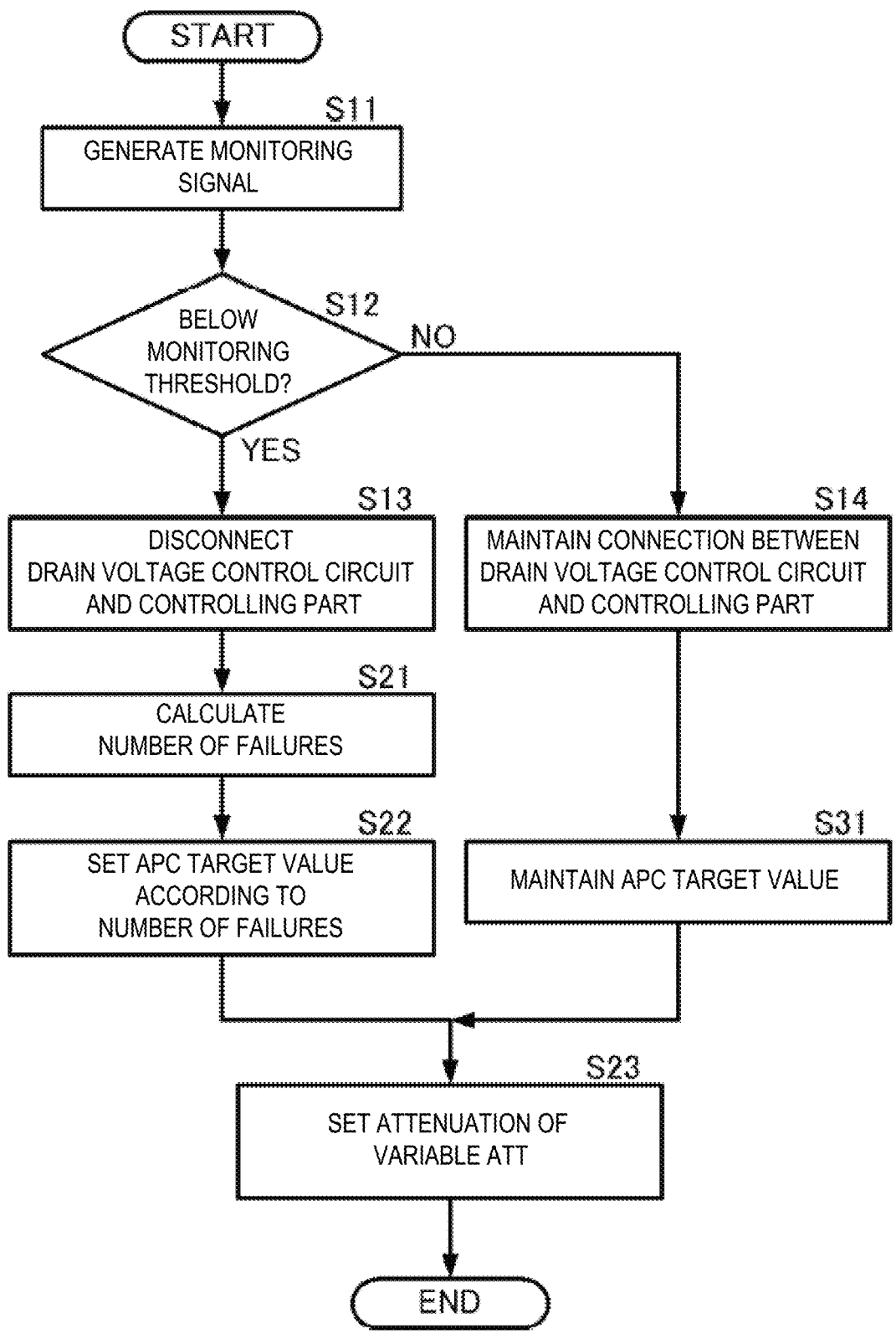
FIG. 8 is a flowchart illustrating the failsafe processing and a first transmission control according to this embodiment of the present disclosure.

The transmission device 10 may perform a processing as the transmission control along with the failsafe processing, in accordance with a flow illustrated in FIG. 8, for example. FIG. 8 is a flowchart illustrating the failsafe processing and a first transmission control according to this embodiment of the present disclosure. Note that the failsafe processing may be similar to that of FIG. 4, and description of the similar parts is omitted suitably.

As illustrated in FIG. 8, the power source line monitoring IC 351-354 of each amplifying circuit in the final-stage amplifying part 20 may detect the voltage of each fuse 32 at the drain voltage control circuit 33 side, and generate the monitoring signal (S11).

If the signal intensity of the monitoring signal becomes below the monitoring threshold (S12: YES), the switch 34 of each amplifying circuit in the final-stage amplifying part 20 may disconnect the drain voltage control circuit 33 and the controlling part 40 (S13).

The failure count detecting part 60 may generate the failure count detection signal based on the monitoring signal, and the controlling part 40 may calculate the number of failures based on the signal intensity of the failure count detection signal (S21). The controlling part 40 may set the APC target value according to the number of failures (S22).

The controlling part 40 may set the attenuation of the variable ATT 42 according to the APC target value (S23). In more detail, the controlling part 40 may set the attenuation of the variable ATT 42 based on a difference between the signal intensity of the reference signal of the transmission signal and the APC target value.

If the signal intensity of the monitoring signal is not below the monitoring threshold (S12: NO), the switch 34 of each amplifying circuit in the final-stage amplifying part 20 may maintain the connection between the drain voltage control circuit 33 and the controlling part 40 (S14).

Since there is no failed amplifying circuit, the controlling part 40 may maintain the APC target value (S31). The controlling part 40 may set the attenuation of the variable ATT 42 according to the APC target value (S23). In more detail, the controlling part 40 may set the attenuation of the variable ATT 42 based on the difference between the signal intensity of the reference signal of the transmission signal and the APC target value.

By performing such a processing, the transmission control for suppressing the occurrence of the side lobes can be realized, together with the failsafe processing.

(Transmission Control Method #2)

Figure 9:
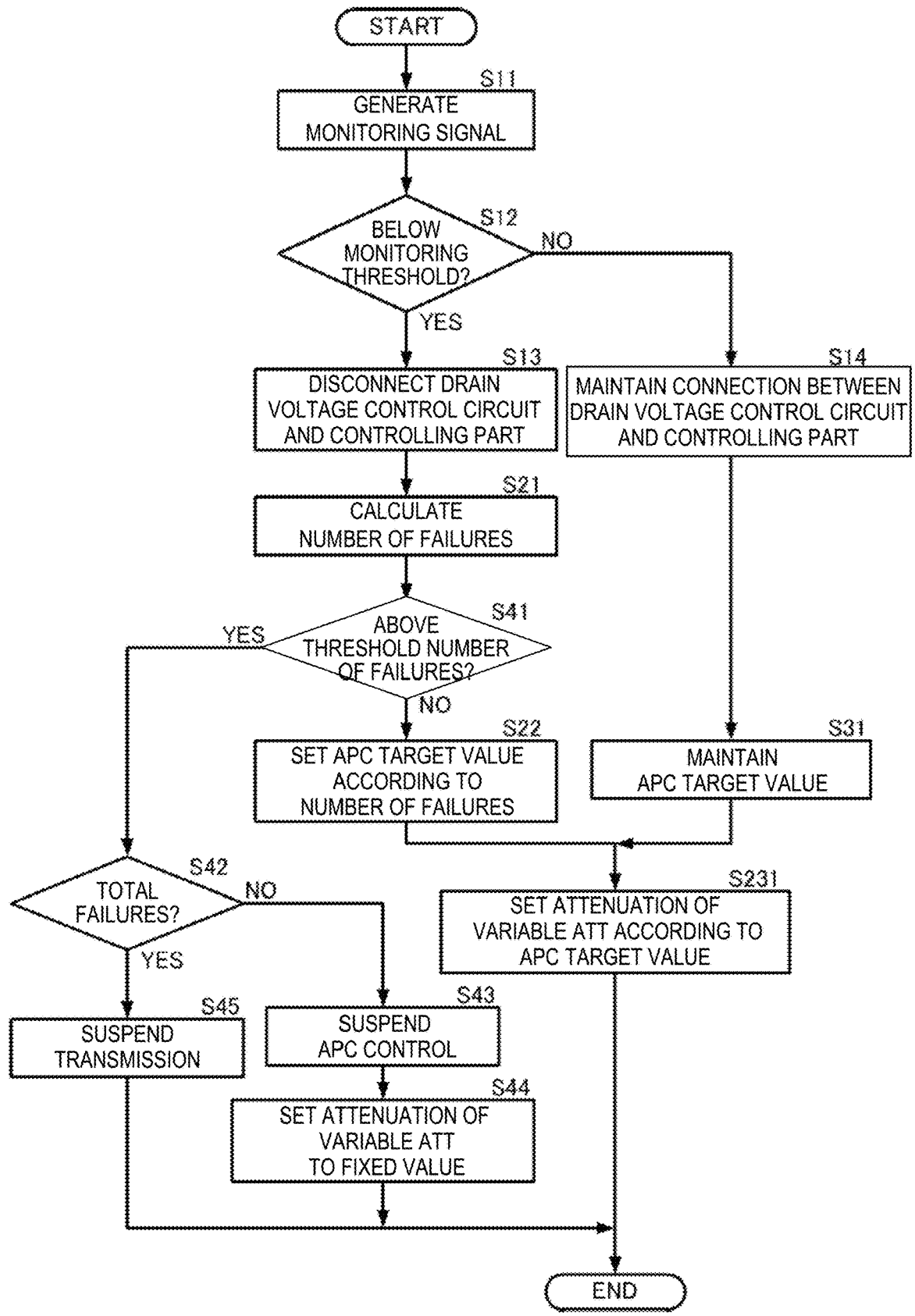
FIG. 9 is a flowchart illustrating the failsafe processing and a second transmission control according to this embodiment of the present disclosure.

The transmission device 10 may perform a processing as the transmission control in accordance with a flow illustrated in FIG. 9, for example, together with the failsafe processing. FIG. 9 is a flowchart illustrating the failsafe processing and a second transmission control according to this embodiment of the present disclosure. Note that the failsafe processing and a part of the transmission control may be similar to those of FIG. 8, and description of the similar parts is omitted suitably.

If there is a failure, processings up to S21 may be similar to those of FIG. 8, and description thereof is omitted. The controlling part 40 may compare the number of failures with a threshold number of failures. If the number of failures is below the threshold number of failures (S41: NO), the controlling part 40 may set the APC target value according to the number of failures (S22). The controlling part 40 may set the attenuation of the variable ATT 42 according to the APC target value (S231). In more detail, the controlling part 40 may set the attenuation of the variable ATT 42 based on the difference between the signal intensity of the reference signal of the transmission signal and the APC target value.

If the number of failures is above the threshold number of failures (S41: YES), the controlling part 40 may detect whether it is the total failure. If it is the total failure (S42: YES), the controlling part 40 may suspend the transmission (S45). If it is not total failure (S42: NO), the controlling part 40 may suspend the APC control (S43). In other words, at S43, the controlling part 40 may suspend the setting of the APC target value, and suspend the control for bringing the signal intensity of the reference signal close to the APC target value. The variable ATT 42 may set the attenuation to a fixed value, if the setting of the attenuation from the controlling part 40 is suspended (S44).

By performing such a processing, a transmission control for suppressing the occurrence of the side lobes similarly to the first transmission control can be realized. Moreover, when the number of failures increases, the setting of the variable ATT for bringing it close to the APC target value may not be controlled stably. In such a case, by setting the attenuation of the variable ATT to the fixed value, the stable transmission control may become possible.

When performing such a second transmission control, the controlling part 40 may also be controlled, for example, according to a control table illustrated in FIG. 10. FIG. 10 is a view illustrating one example of the control table of the second transmission control of the present disclosure. Note that, although FIG. 10 illustrates four amplifying circuits, the number of amplifying circuits is not limited to four, and the table may be set based on a similar concept according to the number of amplifying circuits.

The controlling part 40 may detect the number of failures. If the number of failures is 0 to 3 (i.e., not the total failure), the controlling part 40 may perform a transmission using the operable amplifying circuit(s). On the other hand, if the number of failures is 4 (i.e., the total failure), the controlling part 40 may suspend the transmission.

If the number of failures is 0, the controlling part 40 may set the APC target value to Pn0 and set the attenuation of the variable ATT 42 to ATT0. The attenuation ATT0 may sequentially be updated and set based on a difference between the APC target value Pn0 and the reference signal.

If the number of failures is 1, the controlling part 40 may set the APC target value to Pn1 and set the attenuation of the variable ATT 42 to ATT1. The APC target value Pn1 may be smaller than the APC target value Pn0. The attenuation ATT1 may be sequentially updated and set by a difference between the APC target value Pn1 and the reference signal.

If the number of failures is 2 or 3, the controlling part 40 may suspend the APC control and set the attenuation of the variable ATT 42 to ATTc. The attenuation ATTc may be a fixed value.

(Another Method of Generating Monitoring Signal)

Figure 11:
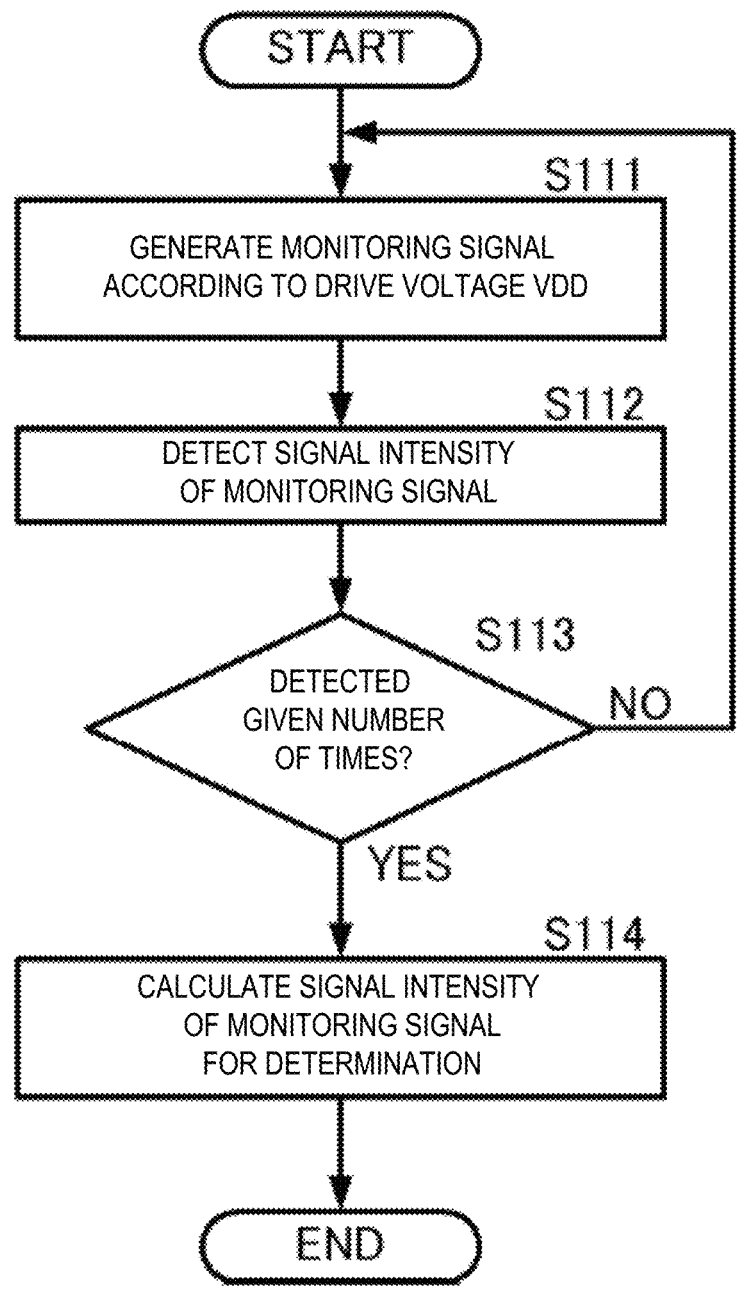
FIG. 11 is a flowchart illustrating one example of a generation processing of a monitoring signal for determination.

Note that, although in the above description the monitoring signal is generated and used at every given sampling timing, monitoring signal for the determination may be generated from monitoring signals at a plurality of sampling timings, and it may be used for the failsafe processing and the transmission control. FIG. 11 is a flowchart illustrating one example of a generation processing of the monitoring signal for the determination.

At the given sampling timing, each power source line monitoring IC 351-354 may generate monitoring signal according to the drive voltage VDD (in more detail, the voltage of the fuse 32 at the drain voltage control circuit 33 side) (S111). The power source line monitoring IC 351-354 may detect and temporarily store the signal intensity of the monitoring signal (S112). The power source line monitoring IC 351-354 may repeat this processing until a given number of times is reached (S113: NO).

If the generation processing of the monitoring signal and the detection processing of the signal intensity are performed for the given number of times (S113: YES), the power source line monitoring IC 351-354 may calculate the signal intensity of the monitoring signal for the determination (S114). The power source line monitoring IC 351-354 may output the monitoring signal for the determination to the switch 34 or the failure count detecting part 60. The switch 34 or the failure count detecting part 60 may perform each processing and control described above by using the signal intensity of the monitoring signal for the determination.

The signal intensity of the monitoring signal for the determination may be calculated, for example, by an average value of the signal intensities of the monitoring signals at the plurality of sampling timings. Alternatively, the signal intensity of the monitoring signal for the determination may be calculated by an average value of the signal intensities of the monitoring signals at the plurality of sampling timings, from which the maximum value and the minimum value are excluded from the signal intensities.

By performing such a processing, the effect of noise contained in the drive voltage VDD can be suppressed. Therefore, the monitoring signal having the more stable signal intensity (the monitoring signal for determination) can be acquired.

Note that although the transmission device having the above configuration is applied, for example, to a radar device, this configuration can be applied to any device which generates the high-frequency signal requiring the high output, by using the semiconductor amplifying circuit.

Moreover, although in the above description the power source line monitoring ICs 351-354 perform the failure detection based on the voltage, they may also be based on current.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processor. A processor can be a microprocessor, but in the alternative, the processor can be a controller, microcontroller, or state machine, combinations of the same, or the like. A processor can include electrical circuitry configured to process computer-executable instructions. In another embodiment, a processor includes an application specific integrated circuit (ASIC), a field programmable gate array (FPGA) or other programmable device that performs logic operations without processing computer-executable instructions. A processor can also be implemented as a combination of computing devices, e.g., a combination of a digital signal processor (DSP) and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C. The same holds true for the use of definite articles used to introduce embodiment recitations. In addition, even if a specific number of an introduced embodiment recitation is explicitly recited, those skilled in the art will recognize that such recitation should typically be interpreted to mean at least the recited number (e.g., the bare recitation of "two recitations," without other modifiers, typically means at least two recitations, or two or more recitations).

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.).

For expository purposes, the term "horizontal" as used herein is defined as a plane parallel to the plane or surface of the floor of the area in which the system being described is used or the method being described is performed, regardless of its orientation. The term "floor" can be interchanged with the term "ground" or "water surface." The term "vertical" refers to a direction perpendicular to the horizontal as just defined. Terms such as "above," "below," "bottom," "top," "side," "higher," "lower," "upper," "over," and "under," are defined with respect to the horizontal plane.

As used herein, the terms "attached," "connected," "mated," and other such relational terms should be construed, unless otherwise noted, to include removable, moveable, fixed, adjustable, and/or releasable connections or attachments. The connections/attachments can include direct connections and/or connections having intermediate structure between the two components discussed.

Numbers preceded by a term such as "approximately," "about," and "substantially" as used herein include the recited numbers, and also represent an amount close to the stated amount that still performs a desired function or achieves a desired result. For example, the terms "approximately," "about," and "substantially" may refer to an amount that is within less than 10% of the stated amount. Features of embodiments disclosed herein preceded by a term such as "approximately," "about," and "substantially" as used herein represent the feature with some variability that still performs a desired function or achieves a desired result for that feature.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. An amplifying apparatus, comprising:
a power-source main line; and
a plurality of amplifying control devices comprising:
an amplifier configured to amplify a high-frequency signal;
a power-source branch line, branched from the power-source main line;
an over current protector disposed for the power-source branch line connected to the amplifier and configured to disconnect the power-source branch line based on drive current flowing through the amplifier from the power-source branch line;
monitoring circuitry configured to generate a monitoring signal based on a change in the drive current or a change in a drive voltage corresponding to the drive current; and
a failure count detector configured to output a failure count detection signal indicative of a number of failures that is a number of power-source branch lines disconnected by the over current protector, based on a signal intensity of the monitoring signal,
wherein the power-source main line is common to the plurality of amplifying control devices.

2. The amplifying apparatus of claim 1, comprising a synthesizer configured to synthesize the high-frequency signals outputted from the amplifiers.

3. A radar device, comprising:
the amplifying apparatus of claim 2, and
an antenna connected to the synthesizer and configured to transmit the synthesized high-frequency signal.

4. The amplifying apparatus of claim 1, comprising adjusting circuitry configured to adjust an input intensity of the high-frequency signal into the amplifiers based on the number of failures.

5. The amplifying apparatus of claim 4, comprising a parameter controller configured to set a parameter of the adjusting circuitry based on the number of failures.

6. The amplifying apparatus of claim 5, wherein the adjusting circuitry sets the parameter to a fixed value when the number of failures is over a threshold.

7. The amplifying apparatus of claim 5, wherein the parameter controller sets the parameter based on signal intensities of the high-frequency signals outputted from the amplifiers.

8. The amplifying apparatus of claim 6, wherein the parameter controller sets the parameter based on signal intensities of the high-frequency signals outputted from the amplifiers.

9. The amplifying apparatus of claim 7, wherein the parameter controller sets the parameter based on a target value of the signal intensity according to the number of failures.

10. The amplifying apparatus of claim 8, wherein the parameter controller sets the parameter based on a target value of the signal intensity according to the number of failures.

11. The amplifying apparatus of claim 4, wherein the adjusting circuitry is comprising a variable attenuator connected to input of the amplifier.

12. The amplifying apparatus of claim 5, wherein the adjusting circuitry is comprising a variable attenuator connected to input of the amplifier.

13. The amplifying apparatus of claim 6, wherein the adjusting circuitry is comprising a variable attenuator connected to input of the amplifier.

14. The amplifying apparatus of claim 7, wherein the adjusting circuitry is comprising a variable attenuator connected to input of the amplifier.

15. The amplifying apparatus of claim 8, wherein the adjusting circuitry is comprising a variable attenuator connected to input of the amplifier.

16. The amplifying apparatus of claim 9, wherein the adjusting circuitry is comprising a variable attenuator connected to input of the amplifier.

17. The amplifying apparatus of claim 1, comprising a switch configured to switch on/off a power supply of the amplifier based on the monitoring signal.

18. The amplifying apparatus of claim 1, comprising a switch configured to switch on/off a power supply of the amplifier based on the monitoring signal.

* * * * *